United States Patent

Tani et al.

Patent Number: 5,336,301
Date of Patent: Aug. 9, 1994

[54] CONDUCTIVE COPPER PASTE

[75] Inventors: Hiroji Tani, Nagaokakyo; Kanehito Honma, Shiga, both of Japan

[73] Assignee: Murata Manufacturing Co., Ltd., Japan

[21] Appl. No.: 20,135

[22] Filed: Feb. 19, 1993

[30] Foreign Application Priority Data

Feb. 20, 1992 [JP] Japan ................... 4-033189

[51] Int. Cl.$^5$ .................. C09D 5/24; H01B 1/08
[52] U.S. Cl. ................... 106/1.18; 106/1.26; 252/512; 252/518; 427/123; 427/383.5
[58] Field of Search ............ 106/1.13, 1.18, 1.26; 252/512, 518; 427/123, 383.5

[56] References Cited

U.S. PATENT DOCUMENTS

| 4,865,772 | 9/1989 | Suehiro et al. | 252/512 |
| 4,873,022 | 10/1989 | Ogawa et al. | 252/512 |
| 4,906,404 | 3/1990 | Suehiro et al. | 106/1.13 |
| 4,937,016 | 6/1990 | Suehiro et al. | 106/1.13 |
| 5,035,837 | 7/1991 | Saeki et al. | 106/1.13 |
| 5,066,620 | 11/1991 | Sunahara et al. | 106/1.14 |
| 5,174,925 | 12/1992 | Fujii et al. | 252/518 |
| 5,198,154 | 3/1993 | Yokoyama et al. | 252/512 |

FOREIGN PATENT DOCUMENTS

| 167272 | 7/1987 | Japan . |
| 81866 | 3/1989 | Japan . |
| 89387 | 3/1990 | Japan . |
| 167713 | 7/1991 | Japan . |
| 31336 | 2/1992 | Japan . |

*Primary Examiner*—Helene Klemanski
*Attorney, Agent, or Firm*—Ostrolenk, Faber, Gerb & Soffen

[57] ABSTRACT

A conductive copper paste contains copper powder and a glass frit of a zinc borosilicate system as a solid component dispersed in an organic vehicle. The content of said glass frit in the solid component falls in a range of 0.5 to 8 percent by weight. The paste is applied to ceramic green sheets and fired simultaneously with the ceramic green sheets to provide copper coatings on the ceramic sheets.

11 Claims, No Drawings

CONDUCTIVE COPPER PASTE

BACKGROUND OF THE INVENTION

1. Field of the Invention

The present invention relates to a conductive copper paste used to form conductive coatings on substrates such as ceramics, insulators and the like.

2. Description of the Prior Art

In general, it is customary to use a conductive paste to form conductive coatings such as conductive patterns of printed circuit boards, electrodes of ceramic capacitors and the like. For example, printed circuit boards are manufactured by the steps of preparing ceramic green sheets, firing the ceramic green sheets to prepare sintered ceramic sheets, applying a conductive paste on the resultant sintered ceramic sheets by screen printing, and then firing the printed ceramic sheets to change the coated conductive paste into a conductive coating. Alternatively, printed circuit boards are manufactured by the steps of preparing ceramic green sheets, applying a conductive paste on the green sheet by screen printing or coating, and firing the coated green sheets to produce sintered ceramic sheets with baked conductive coatings.

The conductive paste used in such manufacturing steps consists of a copper powder dispersed in an organic vehicle to minimize warps or strains of the substrates which are caused by a difference in shrinkage factor between the conductive paste and the ceramic green sheet.

However, such a conductive paste has the following problems. For example, it requires firing or baking in a non-oxidizing atmosphere to prevent the copper from oxidizing. For this reason, former process requires the firing twice, thus making it difficult to improve the production efficiency of printed circuit boards. The latter process makes it possible to improve the efficiency of production by sintering the ceramic sheet simultaneously with the baking of the conductive paste coating on the ceramic green sheet. However, this process has a problem in that the conductive coating occasionally peels off from the substrate because of poor bond strength between the ceramic substrate and the baked conductive coatings. This problem also applies to the former process as the second firing must be carried out under the same conditions as that of the latter.

To solve such problems, the inventors have tried to incorporate glass frit of a lead borosilicate system into a conductive paste consisting of copper powder dispersed in an organic vehicle. However, it is considerably difficult to improve the bond strength between the ceramic substrate and the baked conductive coating as lead oxide contained in the glass frit is reduced to a metal during firing in the non-oxidizing atmosphere.

SUMMARY OF THE INVENTION

It is therefore an object of the present invention to provide a conductive copper paste which overcomes the aforesaid disadvantages and enables conductive coatings to be produced on ceramic substrates with improved bond strength between a baked conductive coating and a ceramic substrate.

Another object of the present invention is to provide a method for production of conductive coatings on ceramic substrates which makes it possible to improve the bond strength between ceramic substrates and conductive copper layers formed thereon.

According to the present invention, the above and other objects are achieved by providing a conductive copper paste adapted to be coated on ceramic green sheets and fired simultaneously with the ceramic green sheets to provide baked copper coatings, said conductive paste containing copper powder and a glass frit of a zinc borosilicate system as a solid component dispersed in an organic vehicle, the content of said glass frit in the solid component falling in the range of 0.5 to 8 percent by weight.

It is preferred to use a copper powder which is free from oxidation and has a particle diameter of 0.1 to 5 $\mu$m.

As a zinc borosilicate, a composition may be used consisting essentially of 40 to 50 wt% of $B_2O_3$, 5 to 20 wt% of $SiO_2$, 30 to 40 wt% of ZnO, and inevitable impurities including alkali metal oxides and/or alkaline-earth metal oxides.

These and other objects and features of the present invention will become clear from the following description taken in conjunction with examples thereof applied for production of conductive circuits on circuit boards.

EXAMPLES

Using spherical copper powder with a mean particle diameter of 1.5 $\mu$m and zinc borosilicate glass frit as a solid component, five samples of conductive copper pastes were prepared by dispersing the solid component in an organic vehicle composed of 8 wt% of ethyl cellulose and 92 wt% of α-terpineol so that each resultant conductive copper paste has a composition shown in Table 1.

TABLE 1

| No. | Conductive paste (wt %) | | | Content of glass frit (wt %) |
| --- | --- | --- | --- | --- |
| | Copper powder | Glass frit | Vehicle | |
| 1 | 80 | 0 | 20 | 0 |
| 2 | 79.6 | 0.4 | 20 | 0.5 |
| 3 | 79.2 | 0.8 | 20 | 1 |
| 4 | 76.8 | 3.2 | 20 | 4 |
| 5 | 73.6 | 6.4 | 20 | 8 |
| 6* | 67.2 | 12.8 | 20 | 16 |

Each conductive copper paste was applied on ceramic green sheets of $BaO \cdot Al_2O_3 \cdot SiO_2$ by screen process printing, dried at 150° C. for 5 minutes, and then fired at 1000° C. for 1 hour in a non-oxidizing atmosphere composed of nitrogen to sinter the ceramic green sheets as well as to bake the copper paste coated thereon. Each resultant specimen, i.e., printed circuit boards, consists of a sintered ceramic sheet with a copper coating baked thereon.

Each printed circuit board was provided with a lead wire extending in a direction normal to the surface of the copper coating by soldering. The bond strength between the ceramic sheet and the copper coating was then measured and the solderability of the copper coating evaluated by visual inspection. The results are shown in Table 2.

The bond strength is given by a maximum value of an external force required for peeling off the copper coating from the ceramic substrate by pulling the lead wire in the direction normal to the surface of the copper coating. In this case, the wire is soldered to the copper coating so as to have a soldered surface area of 2 mm × 1.5 mm. The solderbility was determined by visually inspecting a surface area of solder adhered to the copper coating by dipping the specimen in a solder bath. The destructive mode indicates the behavior of destruction of the specimen when the lead wire is pulled by an external force beyond the bond strength shown in Table 2. In Table 2, "Electrode peel off" means that the copper coating was peeled off from the ceramic substrate by the external force, while "Substrate broken" means that the substrate was broken down by the external force as the copper coating is firmly bonded to the ceramic substrate.

TABLE 2

| No. | Bond strength (Kg) | Solderbility | Destructive Mode |
| --- | --- | --- | --- |
| 1 | 0.7 | Good | Electrode peel off |
| 2 | 1.0 | Good | Substrate broken |
| 3 | 1.2 | Good | Substrate broken |
| 4 | 2.2 | Good | Substrate broken |
| 5 | 2.9 | Good | Substrate broken |
| 6* | — | Bad | — |

From the results shown in Table 2, it can be seen that specimen No. 1 made from the conductive copper paste containing no glass frit has a poor bond strength and causes the copper coating to be peeled off by the external force, while specimens Nos. 2 –5 made from the conductive copper paste of the present invention have a considerably improved bond strength as they cause the substrate to break without causing the copper coating to peel off.

The reasons why the content of the glass frit of zinc borosilicate in the solid component of the paste has been limited to the above range are as follows. If the content of zinc borosilicate glass frit is less than 0.5 % by weight, it is difficult to improve the bond strength between the conductive coating and the substrate. If the content of the glass frit in the solid component exceeds 8% by weight, like in specimen No. 6, the conductive copper paste can not be put into practical use as the solderbility of the copper coating becomes considerably lowered.

Although the present invention has been fully described in connection with the preferred embodiments thereof, it is to be noted that various changes and modifications are apparent to those skilled in the art. Such changes and modifications are to be understood as included within the scope of the present invention as defined by the appended claims unless they depart therefrom.

What is claimed is:

1. A conductive copper paste for formation of copper coatings on ceramic substrates, the conductive copper paste consisting essentially of a solid component dispersed in an organic vehicle, the solid component consisting essentially of about 0.5 to 8 percent by weight of a zinc borosilicate glass frit and the remainder of a copper powder, the glass frit consisting essentially of about 40 to 50% by weight of $B_2O_3$, about 5 to 20% by weight of $SiO_2$ and about 30 to 40% by weight of ZnO.

2. The conductive copper paste according to claim 1 in combination with a ceramic substrate wherein the ceramic substrate is made of a $BaO.Al_2O_3.SiO_2$ system.

3. The conductive copper paste according to claim 1 wherein the conductive copper paste consists essentially of, by weight, about 73.6 to 79.6% copper powder, about 0.4 to 6.4% glass frit, and the remainder of an organic binder.

4. The conductive copper paste according to claim 1 wherein the copper powder has a particle size of about 0.1 to 5 $\mu$m.

5. A method of forming a conductive coating on a ceramic substrate, comprising the steps of:
   (a) dispersing a copper powder and about 0.5 to 8 percent by weight of a glass frit of a zinc borosilicate system in an organic vehicle to prepare a conductive copper paste;
   (b) applying the resultant conductive copper paste on a ceramic substrate made of a $BaO.Al_2O_3.SiO_2$ system; and,
   (c) firing the ceramic substrate coated with the conductive copper paste in a non-oxidizing atmosphere.

6. The method according to claim 5 wherein the glass frit consists essentially of about 40 to 50% by weight of $B_2O_3$, about 5 to 20% by weight of $SiO_2$ and about 30 to 40% by weight of ZnO.

7. A conductive copper paste for formation of a copper coating on a ceramic substrate, the conductive copper paste comprising a solid component dispersed in an organic vehicle, the solid component including about 0.5 to 8 percent by weight of a zinc borosilicate glass frit and a copper powder, the glass frit including about 40 to 50% by weight of $B_2O_3$, about 5 to 20% by weight of $SiO_2$ and about 30 to 40% by weight of ZnO.

8. The conductive copper paste according to claim 7 in combination with a ceramic substrate wherein the ceramic substrate is made of a $BaO.Al_2O_3.SiO_2$ system.

9. The conductive copper paste according to claim 7 wherein the conductive copper paste includes, by weight, about 73.6 to 79.6% copper powder, about 0.4 to 6.4% glass frit, and an organic binder.

10. The conductive copper paste according to claim 7 wherein the copper powder has a particle size of about 0.1 to 5 $\mu$m.

11. The method according to claim 5 wherein the glass frit includes about 40 to 50% by weight of $B_2O_3$, about 5 to 20% by weight of $SiO_2$ and about 30 to 40% by weight of ZnO.

* * * * *